(12) United States Patent
Cheng et al.

(10) Patent No.: US 12,504,465 B2
(45) Date of Patent: Dec. 23, 2025

(54) TEST DEVICE FOR OPTOELECTRONIC INTEGRATED CIRCUIT

(71) Applicant: CHUNGHWA PRECISION TEST TECH. CO., LTD., Taoyuan (TW)

(72) Inventors: Jhih-Hong Cheng, Taoyuan (TW); Hsin-Yao Lee, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 136 days.

(21) Appl. No.: 18/433,489

(22) Filed: Feb. 6, 2024

(65) Prior Publication Data

US 2025/0060407 A1   Feb. 20, 2025

(51) Int. Cl.
*G01R 31/28* (2006.01)
*G01R 1/07* (2006.01)
*G02B 6/12* (2006.01)

(52) U.S. Cl.
CPC ......... *G01R 31/2851* (2013.01); *G01R 1/071* (2013.01); *G02B 6/12004* (2013.01)

(58) Field of Classification Search
None
See application file for complete search history.

(56) References Cited

U.S. PATENT DOCUMENTS

| | | | | |
|---|---|---|---|---|
| 7,184,626 B1* | 2/2007 | Gunn, III | ........... | G02B 6/29395 385/37 |
| 7,378,861 B1* | 5/2008 | Malendevich | ........... | G02B 6/30 324/754.23 |
| 8,912,810 B2* | 12/2014 | Hsu | ..................... | G01R 1/07314 324/754.09 |
| 2007/0069756 A1* | 3/2007 | Ambler | ................ | G01R 31/002 324/754.08 |
| 2021/0033643 A1* | 2/2021 | Huebner | ................ | G01R 1/073 |
| 2022/0034750 A1* | 2/2022 | Myslinski | .......... | G01M 11/0214 |
| 2022/0034963 A1* | 2/2022 | Keck | ................ | G01R 31/31903 |

* cited by examiner

*Primary Examiner* — Richard Isla
(74) *Attorney, Agent, or Firm* — Nathan & Associates Patent Agents Ltd.; Menachem Nathan (57) ABSTRACT

A test device for an optoelectronic integrated circuit includes a circuit board, a connecting base, a first light transmission component, and a second light transmission component. The connecting base is arranged on the circuit board and includes a carrier board and a frame. The optoelectronic integrated circuit is arranged on a carrier surface of the carrier board. The first light transmission component is arranged on a side of the frame, includes a first transmission portion, and is located at a first vertical level with respect to the carrier surface. The second light transmission component is arranged on another side of the frame, includes a second transmission portion, and is located at a second vertical level with respect to the carrier surface. A height of the second vertical level is different from a height of the first vertical level.

10 Claims, 7 Drawing Sheets

TEST DEVICE FOR OPTOELECTRONIC INTEGRATED CIRCUIT

CROSS REFERENCE TO RELATED APPLICATIONS

This application claims priority to Taiwan Patent Application No. 112131225, filed Aug. 18, 2023, the disclosure of which is incorporated herein by reference in its entirety.

FIELD OF INVENTION

The present application relates to a technical field of electrical testing, and particularly to a test device for an optoelectronic integrated circuit.

BACKGROUND OF INVENTION

Using photons instead of electrons to perform calculations in integrated circuits along with light as data transmission to reduce product size to chip levels is an inevitable trend in the future. Integrated optoelectronic circuits, also referred to as optoelectronic integrated circuits (OEIC), are applicable to high-performance data exchange, long-distance interconnection, 5G facilities, and computing equipment. Optoelectronic integrated circuits are the same as integrated circuits on many aspects. They all need to be tested either before or after packaging to allow good products to be screened and various electrical characteristic parameters to be obtained. However, test devices for optoelectronic integrated circuits or photonic chips that can meet customized designs are still pending so far. In view of this, it is imperative to provide a test device for testing with the design of optoelectronic integrated circuits to solve the aforementioned problems.

SUMMARY OF INVENTION

An object of the present application is to provide a test device that can perform various test types according to different designs of optoelectronic integrated circuits.

One aspect of the present application provides a test device for an optoelectronic integrated circuit, the test device electrically connected to test equipment, the optoelectronic integrated circuit including at least a light detection module and a light source module, and the test device includes a circuit board electrically connected to the test equipment, a connecting base arranged on the circuit board and including a carrier board and a frame, the carrier board including a carrier surface, the frame configured around the carrier surface, and the optoelectronic integrated circuit arranged on the carrier surface. A first light transmission component is arranged on a side of the frame and includes a first transmission portion located at a first vertical level with respect to the carrier surface, and a second light transmission component is arranged on another side of the frame and includes a second transmission portion located at a second vertical level with respect to the carrier surface. A height of the second vertical level is different than that of the height of the first vertical level.

Preferably, the frame includes a frame wall and a cover arranged on the frame wall, and the frame wall is sandwiched between the carrier board and the cover, the first light transmission component is arranged on the frame wall, and the second light transmission component is arranged on the cover.

Preferably, the first light transmission component further includes a first optical fiber, a first joint, and a first connector, and the first connector is positioned in the frame wall, the first joint is fixed to one end of the first optical fiber and is pluggably connected to the first connector. The first optical fiber includes the first transmission portion, the optoelectronic integrated circuit includes a first optical waveguide, and the first optical fiber is parallel to and faces the first optical waveguide.

Preferably, the first transmission portion is configured to transmit a test optical signal directly emitted from the first transmission portion to the first optical waveguide for detection by the light detection module, or the first transmission portion is configured to transmit an output optical signal generated by the light source module.

Preferably, the second light transmission component includes a second optical fiber, a second joint, and a second connector, and the second connector is positioned between the cover and the frame wall, the second joint is fixed to one end of the second optical fiber and is pluggably connected to the second connector. The second optical fiber includes the second transmission portion, the second connector includes an optical channel, and the optoelectronic integrated circuit comprises a second optical waveguide. The second transmission portion is configured to transmit a test optical signal, which is emitted from above the optoelectronic integrated circuit to the second optical waveguide through the optical channel for detection by the light detection module, or the second transmission portion is configured to transmit an output optical signal generated by the light source module.

Preferably, the second connector of the second light transmission component includes a reflective wall arranged at an acute angle with respect to the second optical fiber and the carrier surface. The reflective wall includes a reflective material with a refractive index greater than that of air, and the test optical signal transmitted by the second transmission portion is reflected to the second optical waveguide through the reflective wall, or the output optical signal transmitted is reflected to the second transmission portion through the reflective wall.

Preferably, the cover includes a slot including an inclined portion, and the inclined portion is arranged at an acute angle with respect to the second optical fiber and the carrier surface and comprises a reflective material with a refractive index greater than that of air. Part of the second connector is embedded in the slot, the optical channel contacts the inclined portion, and the test optical signal transmitted by the second transmission portion is reflected to the second optical waveguide through the inclined portion, or the output optical signal is reflected to the second transmission portion through the inclined portion.

Preferably, the test device further includes a third light transmission component arranged on the cover. The third light transmission component includes a third transmission portion located at a third vertical level with respect to the carrier surface, and a height of the third vertical level is different from that of the first vertical level or the second vertical level.

Preferably, the third light transmission component includes a third optical fiber, a third joint, and a third connector arranged on the cover, and the third joint is fixed to one end of the third optical fiber and is pluggably connected to the third connector. The third optical fiber includes the third transmission portion, and the optoelectronic integrated circuit includes a third optical waveguide. The third transmission portion is inclined to the carrier surface and is configured to transmit a test optical signal directly emitted to the third optical waveguide from above the optoelectronic integrated circuit for detection by the light detection module, or the third transmission portion is configured to transmit an output optical signal generated by the light source module.

Preferably, the third joint includes a grating structure.

Preferably, the test device further includes a fourth light transmission component arranged on the connecting base. The fourth light transmission component includes a fourth optical fiber, a fourth joint, a fourth connector, and an internal optical fiber. The fourth joint is fixed to one end of the fourth optical fiber and is pluggably connected to the fourth connector, one end of the internal optical fiber is connected to the fourth connector, and the other end is connected to the optoelectronic integrated circuit.

Preferably, the fourth connector is positioned in the carrier board, the other end of the internal optical fiber is pluggably connected to the optoelectronic integrated circuit, and the fourth optical fiber transmits a test optical signal to the optoelectronic integrated circuit through the internal optical fiber or receives an output optical signal generated by the light source module through the internal optical fiber.

In the test device provided in the present application, a variety of optical coupling types in different directions are created by the cooperation between the first light transmission component, the second light transmission component, the third light transmission component and/or the fourth light transmission component in the positions of the different vertical levels where the first light transmission component, the second light transmission component, the third light transmission component, and the fourth light transmission component are located, which in turn achieves the requirements of electrical testing for various optoelectronic integrated circuit designs, and solves the problem with conventional single test equipment failing in testing optoelectronic integrated circuits with different designs.

BRIEF DESCRIPTION OF DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The following is a detailed description of the embodiments in conjunction with the accompanying drawings, but the described specific embodiments are only used to explain the present invention, not to limit the present invention, and the description of the structure and operation is not used to limit the order of its execution. Any devices with equivalent functions produced by recombining components are within the scope of the disclosure of the present invention.

It should be noted that in the corresponding drawings of the embodiments, signals are represented by lines. Some lines may be thicker to indicate more component signal pathways, and/or have arrows at one or more ends to indicate primary information flow direction. This indication is not intended to be limiting. Instead, lines are used in conjunction with one or more exemplary embodiments to facilitate easier understanding of circuits or logic units. Signals of any representation, as dictated by design requirements or preferences, may actually include one or more signals that may travel in either direction, and may be implemented with any suitable type of signaling scheme.

In the text below and in the claims, the term "coupled," and its derivatives may be used. The term "coupled" herein refers to two or more elements that are in direct contact (physically, electrically, magnetically, optically, etc.). The term "coupled" herein may also refer to two or more elements that are not in direct contact with each other, but still co-operate or interact with each other.

As used herein, unless otherwise stated, the ordinal adjectives "first," "second," and "third," etc. used herein to describe generic items merely indicate different variations of similar items being referred to. Examples are not intended to imply that objects so described are necessarily in a given order in time, space, in arrangement, or in any other way.

The present application provides a test device for testing electrical characteristics of an optoelectronic integrated circuit. Specifically, the optoelectronic integrated circuit refers to a photonic chip including an electronic integrated circuit (EIC) including a processor, and a photonic integrated circuit (PIC) for electro-optic conversion. Preferably, the optoelectronic integrated circuit can be co-packaged optics (CPO) that integrates electronic integrated circuits and photonic integrated circuits in a single package. It should be noted that the optoelectronic integrated circuit to be tested may include at least a light detection module and a light source module, and a plurality of active components and passive components, such as, but not limited to filters or multiplexing structures, optical power distribution structures, optical fiber output and input structure, and light modulation structure. Since the features of the present application do not lie in the detailed structure of the optical active and passive components known to those skilled in the art, it will not be described in detail here.

Figure 1:
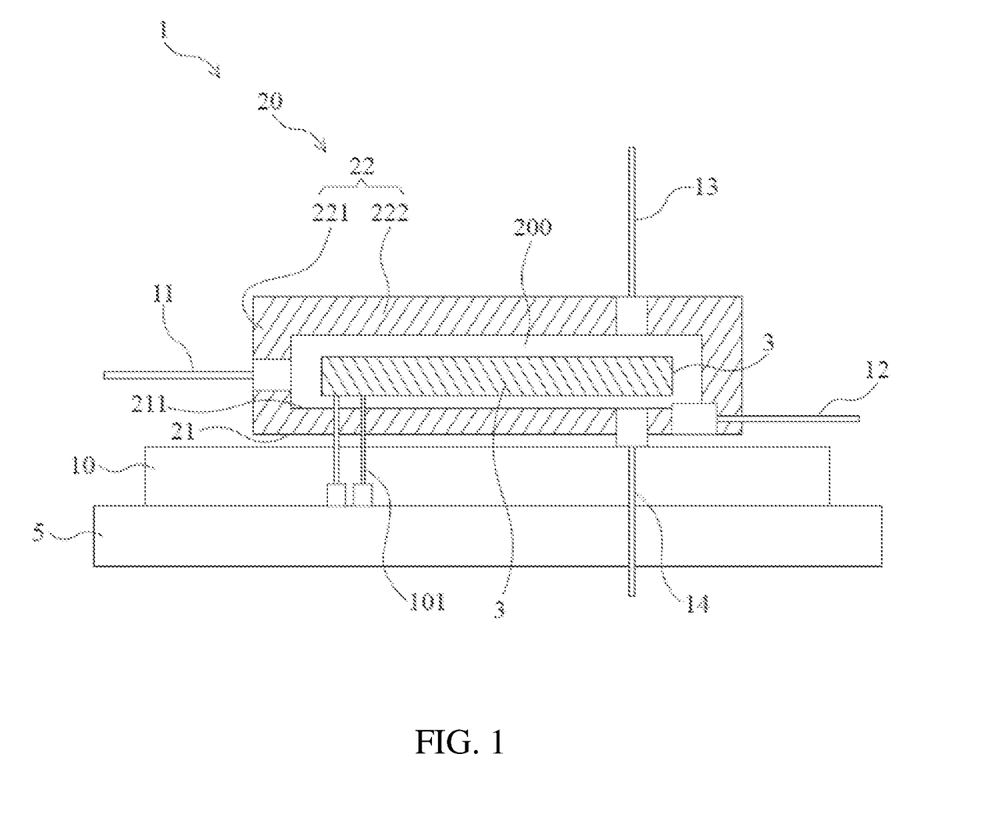
FIG. 1 is a schematic structural view of a test device for an optoelectronic integrated circuit in an embodiment of the present application.
Figure 2:
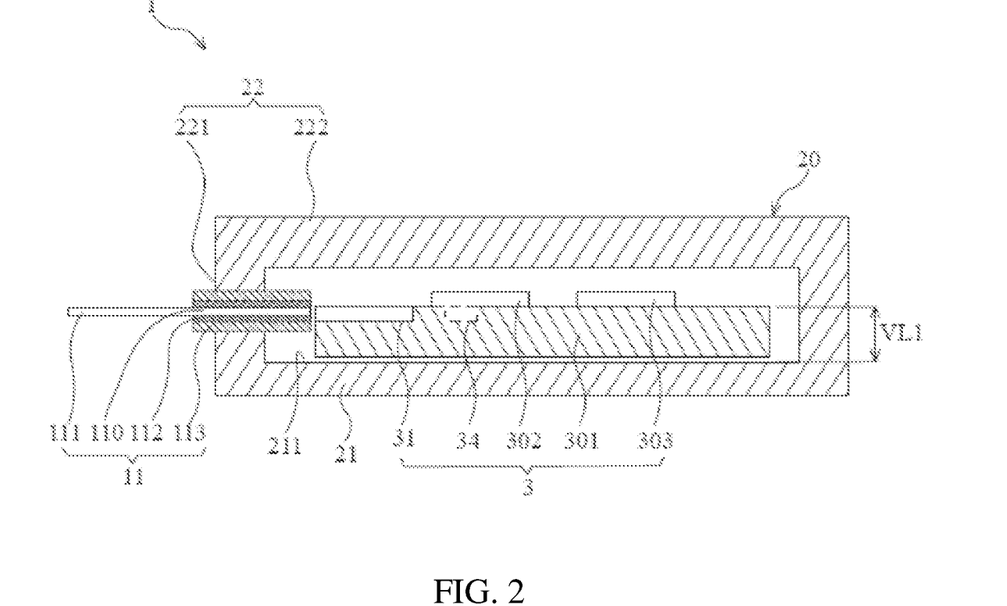
FIG. 2 is a schematic partial structural view of a test device in an embodiment of the present application.

Referring to FIG. 1, FIG. 1 is a schematic structural view of a test device for an optoelectronic integrated circuit of the present application. The embodiment of the present application provides a test device 1 for testing electrical characteristics of the optoelectronic integrated circuit 3. In some embodiments, the test device 1 may be used in a final test (FT) stage after packaging of the optoelectronic integrated circuit 3 or at a chip probing (CP) stage for testing. In some embodiments, the optoelectronic integrated circuit 3 is manufactured using a silicon on insulator (SOI) wafer, and includes a substrate 301, an optical module 302, and an electronic module 303 (as shown in FIG. 2). The test device 1 of the present application is electrically connected to test equipment 5 (as shown in FIG. 1), which may be automatic test equipment (ATE) for testing functional features of a chip. The test device 1 includes a circuit board 10, a connecting base 20, and a plurality of light transmission components disposed on the connecting base 20. In some embodiments, the light transmission components include a first light transmission component 11, a second light transmission component 12, a third light transmission component 13, and/or a fourth light transmission component 14. The connecting base 20 is arranged on the circuit board 10 and is configured according to sizes of the optoelectronic integrated circuit 3 to be tested and positions of a bump array of the optoelectronic integrated circuit 3. The circuit board 10 is electrically connected to the test equipment 5 and located between a top of the test equipment 5 and the connecting base 20 for transmitting electrical signals between the optoelectronic integrated circuit 3 and the test equipment 5. In some embodiments, the circuit board 10 includes a plurality of probes 101 for contacting the bump array of the optoelectronic integrated circuit 3, so that the electrical signals can be transmitted between the optoelectronic integrated circuit 3 and the test equipment 5. In particular, the positions of the first light transmission component 11, the second light transmission component 12, the third light transmission component 13, and the fourth light transmission component 14 on the connecting base 20 shown in FIG. 1 are only for illustration, and an actual arrangement of the above-mentioned light transmission components may be determined according to the configuration of the optoelectronic integrated circuit 3.

Still referring to FIG. 1, in some embodiments, the connecting base 20 has a substantially rectangular cross-section and includes a carrier board 21 and a frame 22. The frame 22 includes a frame wall 221 and a cover 222. Specifically, the frame wall 221 is disposed around the carrier board 21 and sandwiched between the carrier board 21 and the cover 222, and the cover 222 can optionally cover the frame wall 221. The carrier board 21 includes a carrier surface 211 and forms an accommodating space 200 together with the frame wall 221 and the cover 222. The optoelectronic integrated circuit 3 is positioned on the carrier surface 211 in the accommodating space 200 and is surrounded by the frame wall 211 and the cover 222.

The first light transmission component 11, the second light transmission component 12, the third light transmission component 13, and the fourth light transmission component 14 in the embodiments of the present application utilizes optical fibers as a medium to transmit optical signals. In some embodiments, the optical fibers may be, for example, a single-mode optical fiber, a polarization-maintaining optical fiber, or a lensed optical fiber, but are not limited to the types of the foregoing optical fibers. The optical fibers mainly operate for a wavelength range of 1100 nanometers (nm) to 2000 nm. Preferably, the wavelength is 1550 nm known as infrared light.

Referring to FIG. 2, FIG. 2 is a schematic partial structural view of the test device 1 of the present application, intended to illustrate the structural relationship between the first light transmission component 11, the optoelectronic integrated circuit 3, and the connecting base 20. As shown in FIG. 2, the first light transmission component 11 is arranged on a side of the frame wall 221 and includes a first optical fiber 111, a first joint 112, and a first connector 113.

The first connector 113 is embedded in the frame wall 221 and communicated with the accommodating space 200. The first joint 112 is fixed to one end of the first optical fiber 111 and is pluggably connected to the first connector 113. In some embodiments, the first joint 112 may be made of metal or ceramic material and have a structure such as a ferrule to provide good protection for the first optical fiber 111 and prevent signal transmission from being affected by external factors. In some other embodiments, the first joint 112 may have a V-groove grating structure, so that the first optical fiber 111 is plural in number and arranged in an optical fiber array, which in turn reduces signal loss resulting from optical coupling alignment with the optical waveguide structure.

As shown in FIG. 2, specifically, the first optical fiber 111 includes a first transmission portion 110, which includes a core and a cladding (not shown for clarity), and one end of the first transmission portion 110 is located at a first vertical level VL1 with respect to the carrier surface 211. In some embodiments, the optoelectronic integrated circuit 3 includes a first optical waveguide 31 made of a material with a refractive index greater than that of air. In some embodiments, the optical waveguide of the optoelectronic integrated circuit 3 has a refractive index in the range of about 1.45 to about 3.45, and may be composed of a polymeric material such as silicon, silicon oxide, silicon nitride, or silicon oxynitride, but is not limited thereto. The first transmission portion 110 is configured to transmit a test optical signal, which is directly emitted from the first transmission portion 110 to the first optical waveguide 31, so that the test optical signal is transmitted to a light detection module 34 of the optoelectronic integrated circuit 3 through the first optical waveguide 31. Particularly, when the first optical fiber 111 is a single-mode optical fiber, the first transmission portion 110 is arranged in parallel to and face the first optical waveguide 31 at the position of the first vertical level VL1, directly adjacent to an edge of the optoelectronic integrated circuit 3, so that the optical signal can be transmitted between the first transmission portion 110 and the first optical waveguide 31. In another embodiment, when the first optical fiber 111 is a lensed optical fiber, an end of the lensed optical fiber is kept from the edge of the optoelectronic integrated circuit 3 at about 10 microns to about 20 microns, so as to facilitate the refraction of light through the lensed optical fiber to enter the first optical waveguide 31.

Figure 3:
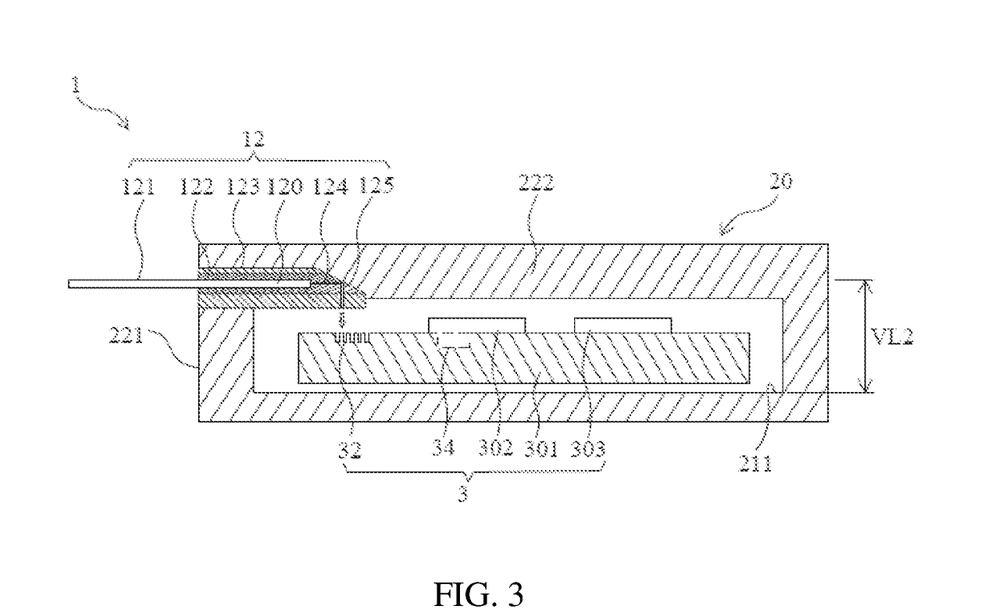
FIG. 3 is a schematic partial structural view of a test device in an embodiment of the present application.

Referring to FIG. 3, FIG. 3 is a schematic structural view of another part of the test device 1, intended to illustrate the structural relationship between the second light transmission component 12, the optoelectronic integrated circuit 3, and the connecting base 20. As shown in FIG. 3, the second light transmission component 12 is arranged on the cover 222 and includes a second optical fiber 121, a second joint 122, and a second connector 123. The second connector 123 is positioned between the cover 222 and the frame wall 221 and communicates with the accommodating space 200. The second joint 122 is fixed to one end of the second optical fiber 121 and is pluggably connected to the second connector 123. In some embodiments, a type of the second joint 122 may be the same as that of the first joint 112, which will not be described in detail here. The second optical fiber 121 includes a second transmission portion 120, and an end of the second transmission portion 120 is located at a second vertical level VL2 with respect to the carrier surface 211, and a height of the second vertical level VL2 is different from the height of the first vertical level VL1. In this embodiment, the second connector 123 includes an optical channel 124, and the optoelectronic integrated circuit 3 includes a second optical waveguide 32. Specifically, the second transmission portion 120 is configured to transmit a test optical signal, which is emitted from above the optoelectronic integrated circuit 3 to the second optical waveguide 32 through the optical channel 124 for detection by the light detection module 34. In some embodiments, the second optical waveguide 32 has a grating structure.

Still referring to FIG. 3, the second connector 123 of the second light transmission component 12 includes a reflective wall 125 arranged at an acute angle with respect to the second optical fiber 121 and the carrier surface 211. Preferably, the reflective wall 125 includes a reflective material with a refractive index greater than that of air. The test optical signal transmitted by the second transmission portion 120 is reflected to the second optical waveguide 32 through the reflective wall 125 and is detected by the light detection module 34.

Figure 4:
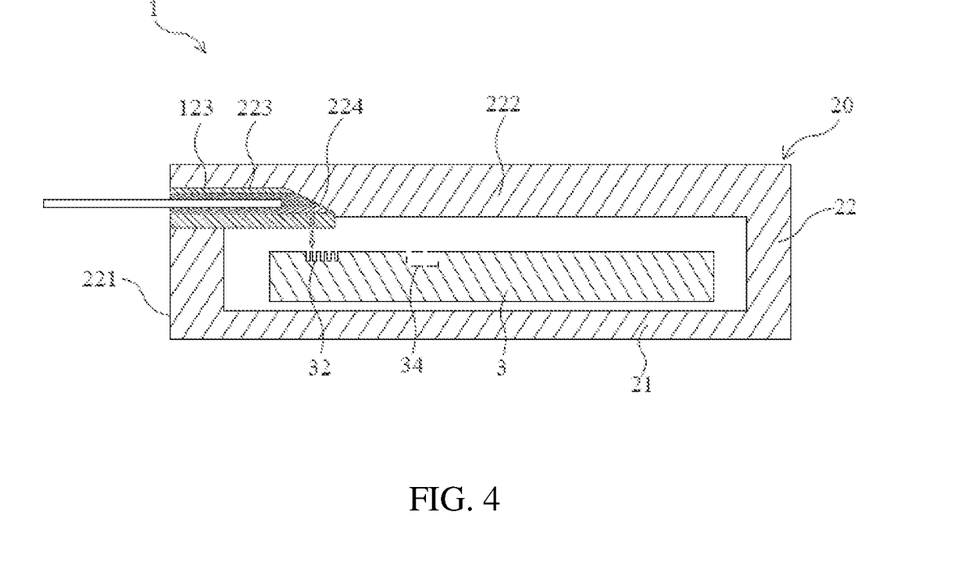
FIG. 4 is a schematic partial structural view of a test device in an embodiment of the present application.

Referring to FIG. 4, FIG. 4 is a schematic structural view of another part of the test device 1, intended to illustrate the structural relationship between the second light transmission component 12, the optoelectronic integrated circuit 3, and the connecting base 20. In this embodiment, the cover 222 includes a slot 223 passing through an outer surface of the frame wall 211 and extending inwardly from the frame wall 221 to the accommodating space 200. Specifically, the slot 223 includes an inclined portion 224 arranged at an acute angle with respect to the second optical fiber 121 and the carrier surface 211. The inclined portion 224 is coated with a reflective material with a refractive index greater than that of air. As shown in FIG. 4, part of the second connector 123 is inserted into the slot 223 such that the light channel 124 is in contact with the inclined portion 224. With the above structure, the test optical signal transmitted by the second transmission portion 120 is reflected to the second optical waveguide 32 through the inclined part 224.

Figure 5:
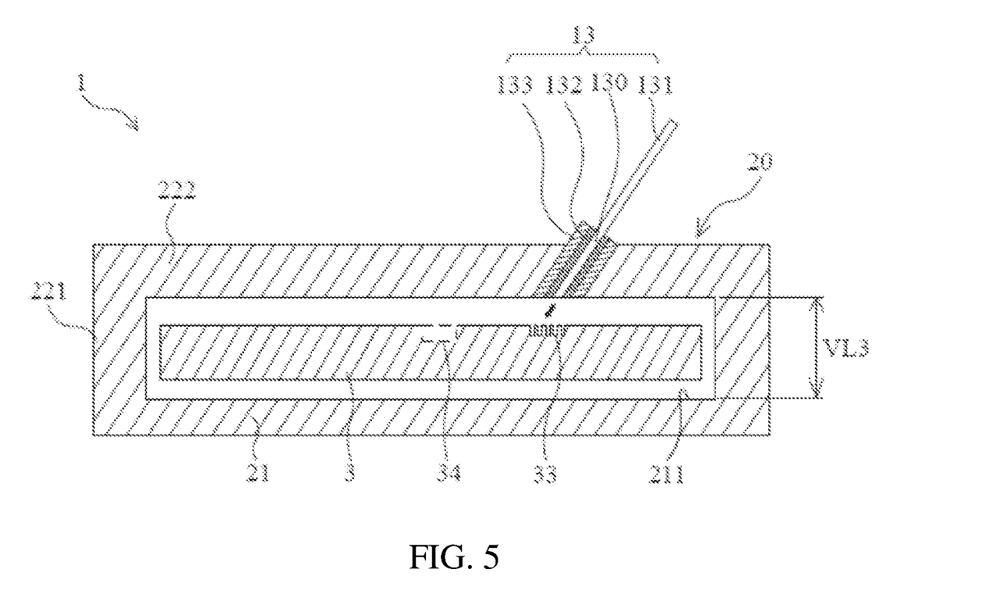
FIG. 5 is a schematic partial structural view of a test device in an embodiment of the present application.

Referring to FIG. 5, FIG. 5 is a schematic structural view of another part of the test device 1, intended to illustrate the structural relationship between the third light transmission component 13, the optoelectronic integrated circuit 3, and the connecting base 20. As shown in FIG. 5, the third light transmission component 13 is arranged on the cover 222 and includes a third optical fiber 131, a third joint 132, and a third connector 133. In this embodiment, the third connector 133 is obliquely embedded in the cover 222 and communicates with the accommodating space 200. In another embodiment, the third connector 133 can also be embedded in the cover 222 substantially perpendicular to the optoelectronic integrated circuit 3. It should be noted that the angle of the third connector 133 relative to the optoelectronic integrated circuit 3 is determined according to the design of the optoelectronic integrated circuit 3. The third joint 132 is fixed to one end of the third optical fiber 131 and is pluggably connected to the third connector 133. The shape of the third joint 132 can be the same as that of the first joint 112, and will not be described in detail here. In this embodiment, the third optical fiber 131 includes a third transmission portion 130, and a light-output end of the third transmission portion 130 is located at a third vertical level VL3 with respect to the carrier surface 211. In this embodiment, a height of the third vertical level VL3 is different from the height of the first vertical level VL1 or the second vertical level VL2. In addition, the optoelectronic integrated circuit 3 includes a third optical waveguide 33, which may have a grating structure as well. The third transmission portion 130 is configured to transmit a test optical signal directly radiates from a top of the optoelectronic integrated circuit 3 to the third optical waveguide 33 and is detected by the light detection module 34.

Figure 6:
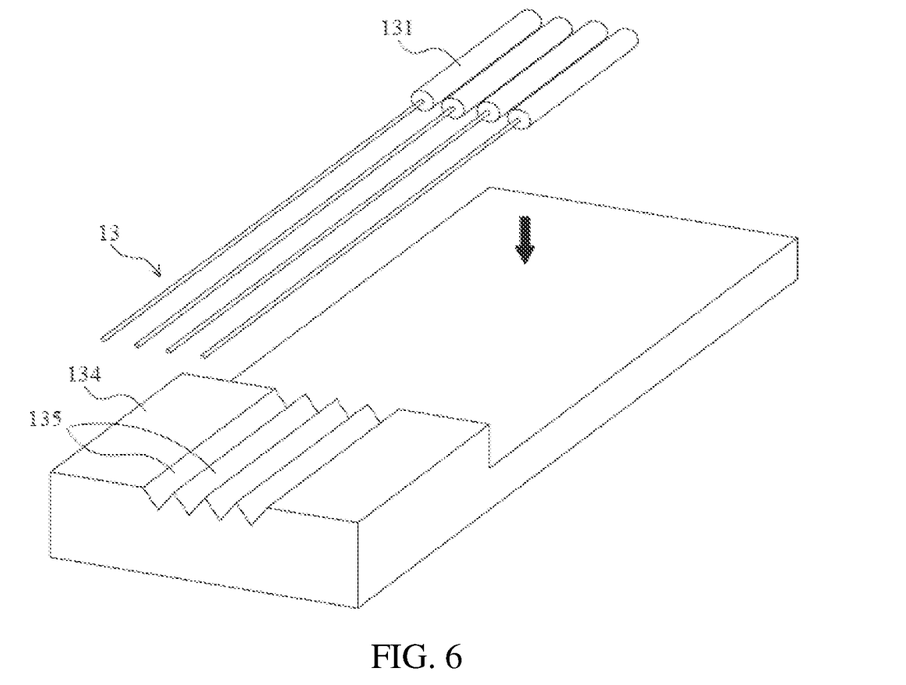
FIG. 6 is a schematic view showing a grating structure of a third light transmission component in an embodiment of the present application.

Referring to FIG. 6, in another embodiment, the third joint 132 of the third light transmission component 13 may include a grating structure 134. As shown in FIG. 6, the grating structure 134 includes a plurality of V-shaped grooves 135 arranged side by side in a row, and the V-shaped grooves 135 are configured for setting bare fiber parts of the third optical fibers 131. The third light transmission component 13 utilizes the grating structure 134 for optical coupling. In some embodiments, in cooperation with the third joint 132 having the grating structure 134, a tapered waveguide array can be formed on the optoelectronic integrated circuit 3 for more effective transmission of the optical signal from the third light transmission component 13.

Figure 7:
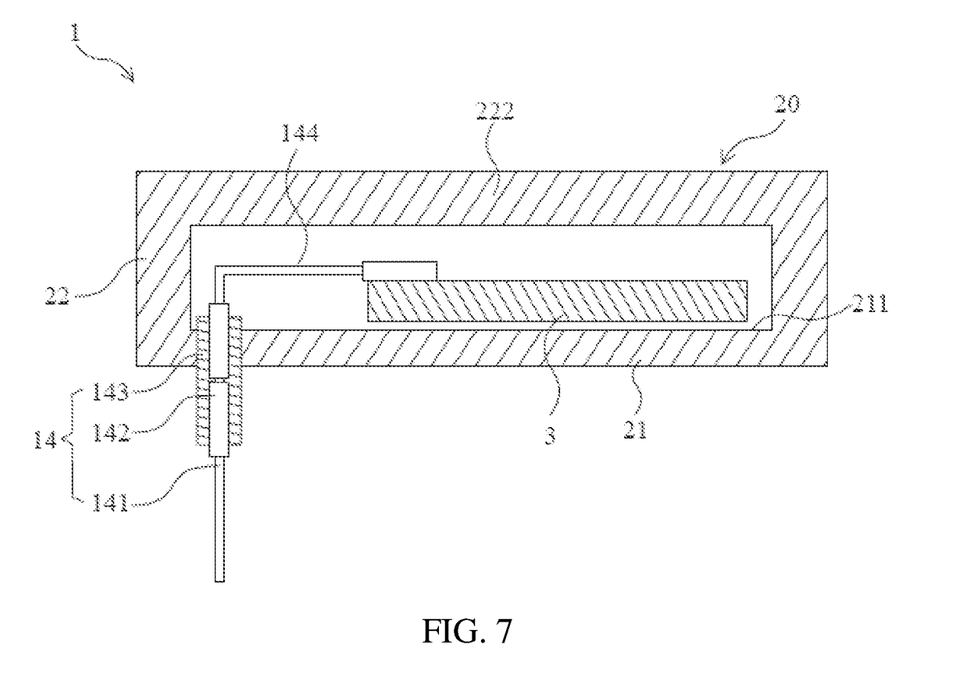
FIG. 7 is a schematic partial structural view of a test device in an embodiment of the present application.

Referring to FIG. 7, FIG. 7 is a schematic structural view of another part of the test device 1, intended to illustrate the structural relationship between the fourth light transmission component 14, the optoelectronic integrated circuit 3, and the connecting base 20. The test device 1 of the present application not only can utilize the light transmission components of the first light transmission component 11, the second light transmission component 12, or the third light transmission component 13 for optical coupling, but also can integrate the optical fiber in advance with the optoelectronic integrated circuit 3 for optical signal transmission. As shown in FIG. 7, the fourth light transmission component 14 includes a fourth optical fiber 141, a fourth joint 142, a fourth connector 143, and an internal optical fiber 144. In some embodiments, the fourth connector 143 is embedded in the carrier board 21 and communicates with the accommodating space 200, and may have a C-shaped sleeve for mating. The fourth joint 142 is fixed to one end of the fourth optical fiber 141 and is pluggably connected to the fourth connector 143. The shape of the fourth joint 142 may be the same as that of the first joint 112, and will not be described in detail here. In some embodiments, the internal optical fiber 144 is arranged in the accommodating space 200. One end of the internal optical fiber 144 is connected to the fourth connector 143, and the other end is pluggably connected to the optoelectronic integrated circuit 3. With the above structure, the fourth optical fiber 141 transmits a test optical signal to the optoelectronic integrated circuit 3 through the internal optical fiber 144.

Figure 8:
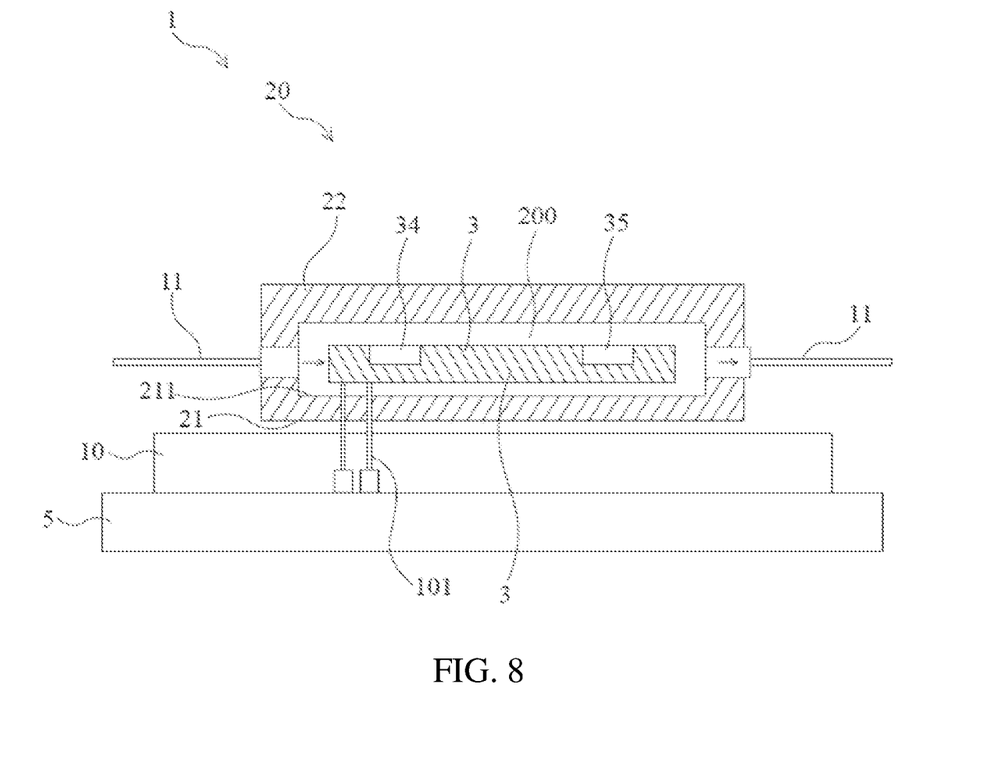
FIG. 8 is a schematic structural view of a test device in an embodiment of the present application.

Referring to FIG. 8, FIG. 8 is a schematic structural view of the test device 1 according to an embodiment of the present application. The optoelectronic integrated circuit 3 (i.e., photonic chip) generally includes the light detection module 34 and the light source module 35. The light detection module 34 is configured to convert the optical signal into the electrical signal, and the light source module 35 is configured to convert the electrical signal into the output optical signal. In order to meet requirements of different designs of the optoelectronic integrated circuit 3 to be tested, the connecting base 20 of the test device 1 of the present application is provided with a plurality of the light transmission components. The test device 1 shown in FIG. 8 is provided with the first light transmission component 11 on one side of the frame wall 221 to emit the test optical signal for the light detection module 34 to receive and convert into the electrical signal. The test device 1 is provided with another first light transmission component 11 on an opposite side of the frame wall 221 for transmitting the optical signal converted from the electrical signal by the light source module 35. That is, in this embodiment, the test optical signal and the output optical signal are transmitted in a same direction. It should be noted that the directions in which the test optical signal and the output optical signal are transmitted are mainly determined according to the configuration of the light detection module 34 and the light source module 35 of the optoelectronic integrated circuit 3. In another embodiment, according to another design of the optoelectronic integrated circuit 3, the test device 1 may be provided with the first light transmission component 11 on one side of the frame wall 221, and the second light transmission component 12 on the opposite side of the frame wall 221 to implement different test types.

Figure 9:
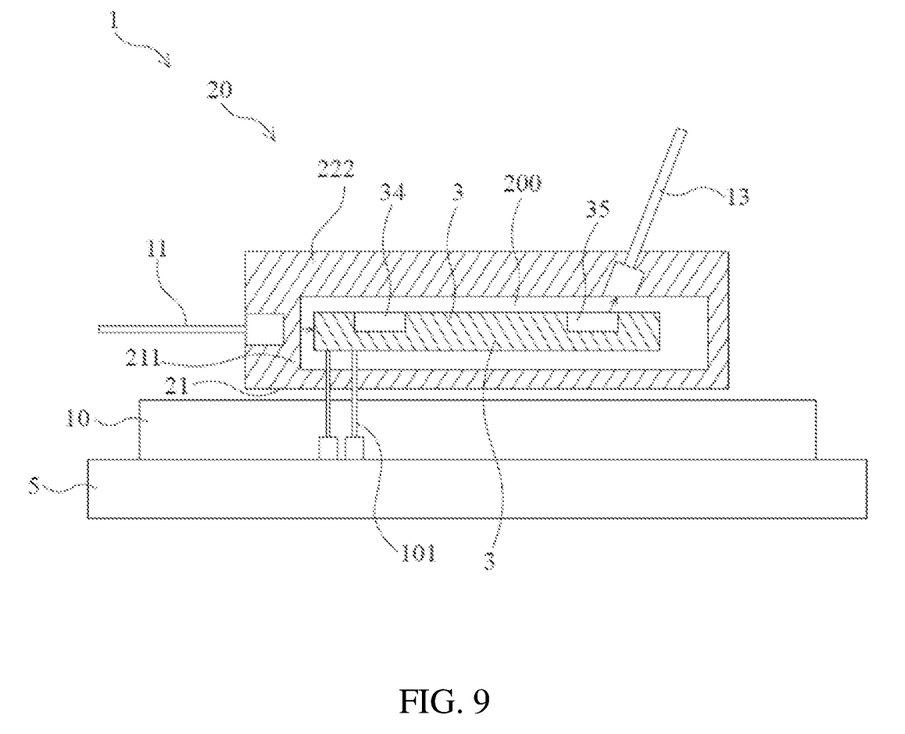
FIG. 9 is a schematic structural view of a test device in another embodiment of the present application.

Referring to FIG. 9, FIG. 9 is a schematic structural view of a test device 1 according to another embodiment of the present application. The test device 1 shown in FIG. 9 is provided with the first light transmission component 11 emitting the test optical signal on one side of the frame wall 221, and the third light transmission component 13 is arranged on the cover 222 for transmitting the output optical signal converted from the electrical signal by the light source module 35. In this embodiment, the test optical signal is transmitted in a horizontal direction relative to the optoelectronic integrated circuit 3, and the output optical signal is transmitted toward the third light transmission component 13 above the optoelectronic integrated circuit 3 to achieve another test type. In some embodiments, the test optical signal can be transmitted by the first light transmission component 11 or the second light transmission component 12, and the output optical signal can be transmitted by the fourth light transmission component 14 (as shown in FIG. 1). The positions for the signal transmission of the test optical signal and the light output signal by the light transmission components mainly depend on the arrangement of the light detection module 34 and the light source module 35 of the optoelectronic integrated circuit 3.

Figure 10:
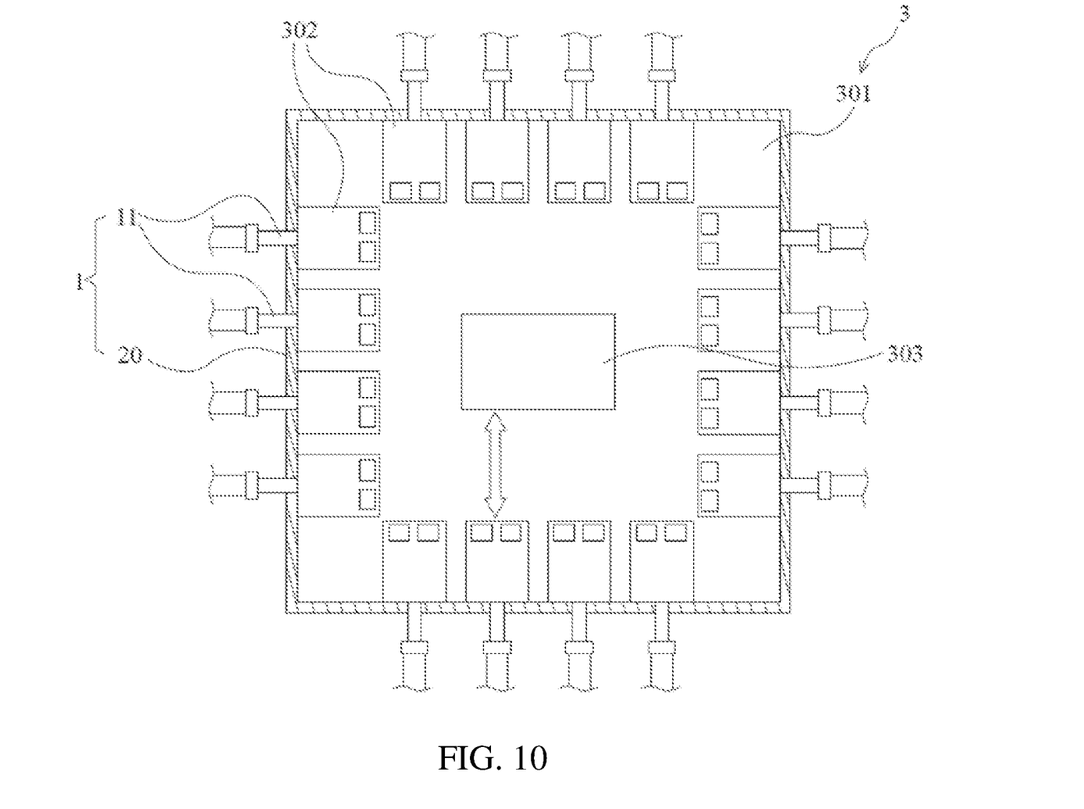
FIG. 10 is a schematic top plan view of a test device in another embodiment of the present application.

Referring to FIG. 10, FIG. 10 is a schematic structural view of a test device 1 according to another embodiment of the present application. In accordance with the design of the optoelectronic integrated circuit 3, each side of the connecting base 20 of the test device 1 can be provided with a plurality of the first light transmission components 11, or any of the light transmission components in the embodiments mentioned above to improve the signal transmission efficiency.

In the test device provided in the present application, a variety of optical coupling types in different directions are created by the cooperation between the first light transmission component, the second light transmission component, the third light transmission component and/or the fourth light transmission component in the positions of the different vertical levels where the first light transmission component, the second light transmission component, the third light transmission component, and the fourth light transmission component are located, which in turn achieves the requirements of electrical testing for various optoelectronic integrated circuit designs, and solves the problem with conventional single test equipment failing in testing optoelectronic integrated circuits with different designs.

References in the specification to "an embodiment," "one embodiment," "some embodiments," or "other embodiments" mean that a particular feature, structure, or characteristic described in connection with the embodiments is included in at least some of the embodiments, but not necessarily included in all examples. The various appearances of "an embodiment," "one embodiment," or "some embodiments" are not necessarily all referring to the same embodiments. If the specification states that an element, feature, structure, or characteristic "may," "may" or "could" be included, then that particular element, feature, structure, or characteristic need not be included. If the specification or claims refer to "a" or "an" element that does not mean there is only one of that element. If the specification or claims refer to "an additional" element, that does not preclude the presence of more than one additional element.

Accordingly, although the present invention has been disclosed as a preferred embodiment, it is not intended to limit the present invention. Those skilled in the art without departing from the scope of the present invention may make various changes or modifications, and thus the scope of the present invention should be after the appended claims and their equivalents.

What is claimed is:

1. A test device for an optoelectronic integrated circuit, the test device electrically connected to test equipment, the optoelectronic integrated circuit comprising at least a light detection module, a light source module, and a first optical waveguide, and the test device comprising:
    a circuit board electrically connected to the test equipment;
    a connecting base arranged on the circuit board and comprising a carrier board and a frame, the carrier board comprising a carrier surface, the frame configured around the carrier surface, and the optoelectronic integrated circuit arranged on the carrier surface, wherein the frame comprises a frame wall and a cover arranged on the frame wall, and the frame wall is sandwiched between the carrier board and the cover;
    a first light transmission component arranged on the frame wall and comprising a first optical fiber, a first joint, and a first connector, wherein the first optical fiber comprises a first transmission portion located at a first vertical level with respect to the carrier surface, the first connector is positioned in the frame wall, the first joint is fixed to one end of the first optical fiber and is pluggably connected to the first connector, and the first optical fiber is parallel to and faces the first optical waveguide; and
    a second light transmission component arranged on the cover and comprising a second transmission portion located at a second vertical level with respect to the carrier surface, wherein a height of the second vertical level is different than that of the height of the first vertical level.

2. The test device for the optoelectronic integrated circuit of claim 1, wherein the first transmission portion is configured to transmit a test optical signal directly emitted from the first transmission portion to the first optical waveguide for detection by the light detection module, or the first transmission portion is configured to transmit an output optical signal generated by the light source module.

3. The test device for the optoelectronic integrated circuit of claim 1, wherein the second light transmission component comprises a second optical fiber, a second joint, and a second connector, the second connector is positioned between the cover and the frame wall, and the second joint is fixed to one end of the second optical fiber and is pluggably connected to the second connector, wherein the second optical fiber comprises the second transmission portion, the second connector comprises an optical channel, and the optoelectronic integrated circuit comprises a second optical waveguide, wherein the second transmission portion is configured to transmit a test optical signal, which is emitted from above the optoelectronic integrated circuit to the second optical waveguide through the optical channel for detection by the light detection module, or the second transmission portion is configured to transmit an output optical signal generated by the light source module.

4. The test device for the optoelectronic integrated circuit of claim 3, wherein the second connector of the second light transmission component comprises a reflective wall arranged at an acute angle with respect to the second optical fiber and the carrier surface, wherein the reflective wall comprises a reflective material with a refractive index greater than that of air, and the test optical signal transmitted by the second transmission portion is reflected to the second optical waveguide through the reflective wall, or the output optical signal transmitted is reflected to the second transmission portion through the reflective wall.

5. The test device for the optoelectronic integrated circuit of claim 3, wherein the cover comprises a slot comprising an inclined portion, and the inclined portion is arranged at an acute angle with respect to the second optical fiber and the carrier surface and comprises a reflective material with a refractive index greater than that of air, wherein part of the second connector is embedded in the slot, the optical channel contacts the inclined portion, and the test optical signal transmitted by the second transmission portion is reflected to the second optical waveguide through the inclined portion, or the output optical signal is reflected to the second transmission portion through the inclined portion.

6. The test device for the optoelectronic integrated circuit of claim 3, further comprising a third light transmission component arranged on the cover, wherein the third light transmission component comprises a third transmission portion located at a third vertical level with respect to the carrier surface, and a height of the third vertical level is different from that of the first vertical level or the second vertical level.

7. The test device for the optoelectronic integrated circuit of claim 6, wherein the third light transmission component comprises a third optical fiber, a third joint, and a third connector arranged on the cover, and the third joint is fixed to one end of the third optical fiber and is pluggably connected to the third connector, wherein the third optical fiber comprises the third transmission portion, and the optoelectronic integrated circuit comprises a third optical waveguide, wherein the third transmission portion is inclined to the carrier surface and is configured to transmit a test optical signal directly emitted to the third optical waveguide from above the optoelectronic integrated circuit for detection by the light detection module, or the third transmission portion is configured to transmit an output optical signal generated by the light source module.

8. The test device for the optoelectronic integrated circuit of claim 7, wherein the third joint comprises a grating structure.

9. The test device for the optoelectronic integrated circuit of claim 7, further comprising a fourth light transmission component arranged on the connecting base, wherein the fourth light transmission component comprises a fourth optical fiber, a fourth joint, a fourth connector, and an internal optical fiber, wherein the fourth joint is fixed to one end of the fourth optical fiber and is pluggably connected to the fourth connector, one end of the internal optical fiber is connected to the fourth connector, and the other end is connected to the optoelectronic integrated circuit.

10. The test device for the optoelectronic integrated circuit of claim 9, wherein the fourth connector is positioned in the carrier board, the other end of the internal optical fiber is pluggably connected to the optoelectronic integrated circuit, and the fourth optical fiber transmits a test optical signal to the optoelectronic integrated circuit through the internal optical fiber or receives an output optical signal generated by the light source module through the internal optical fiber.

* * * * *